United States Patent [19]

Weber

[11] Patent Number: 4,734,638
[45] Date of Patent: Mar. 29, 1988

[54] ELECTRIC OUTLET AND CABLE TRACING METHOD AND APPARATUS

[76] Inventor: Harold J. Weber, 20 Whitney Dr., Sherborn, Mass. 01770

[21] Appl. No.: 867,448

[22] Filed: May 28, 1986

[51] Int. Cl.⁴ ........................................... G01R 19/00
[52] U.S. Cl. .................................................... 324/66
[58] Field of Search ...................... 324/66, 51, 52, 54; 379/10, 12, 25; 340/651

[56] References Cited

U.S. PATENT DOCUMENTS

3,742,350  6/1973  White ..................................... 324/66
3,891,811  6/1975  Miller .................................... 324/66

Primary Examiner—Reinhard J. Eisenzopf
Assistant Examiner—Robert W. Mueller

[57] ABSTRACT

A tradesman may identify which circuit is connected with any number of outlets or other terminations in an electrical wiring system, such as commonly found in buildings, through the use of a handheld, carry-about detector-indicator device. Operation relies upon having prearranged excitation of each of several circuits typical of the usual building power distribution through introducing unique tag signals into each of the various wiring circuits by connecting a tag signal exciter to the building's wiring, usually at the main power box. The tradesman then may merely walk about and "plug" the indicator into various outlets or, by a suitable adaptor or clip leads, connect with lamp receptacles and the like, whereupon the indicator will give display of a "number", for example between "1" and "8", or some other such display which will promptly tell the user which circuit his detection indicator is coupled with.

20 Claims, 9 Drawing Figures

ELECTRIC OUTLET AND CABLE TRACING METHOD AND APPARATUS

BACKGROUND OF INVENTION

The identification of individual electrical circuits, as they connect to outlets and light fixtures, in existing buildings is often the subject of much time consuming effort. In particular, when a building is being renovated, say for subdivision into apartments, it is important to know that the power for one apartment unit is not mistakenly hooked into another apartment unit. It is usually impractical to visually check wire routing or connections, because the wiring is hidden behind walls, etc. Therefore, much time is wasted by electricians or other tradesmen in merely verifying that outlets and fixture connections are unique to each apartment and do not cheat the future tenant by a mix-up in wiring which avails his power to another apartment unit.

Equally important is the verification of load distribution for electrical wiring circuits in new as well as older buildings, such as homes. Clearly it is poor, if not illegal, practice to have an excessive number of outlets or fixtures on one circuit, while loading of another circuit may be minimal. Building codes in many areas require that a limited number of outlets are allowed on most circuits, and that independent circuits must be provided in high use areas, such as kitchens, etc. It is oftimes a requirement now that ground-fault interrupters protect certain circuit branches, and these present a special case for verification by an inspector. Once construction has advanced beyond a certain point (e.g., walls are closed in), or more especially in older buildings that are under renovation, it is, for all practical purposes, impossible to visually acertain circuit distribution by mere inspection of wire routing. It is under these conditions that the tradesman, or the electrical inspector, must rely upon other techniques to verify proper wiring load distribution. Brute force methods are most often relied upon, whereupon power is interrupted from (or applied to) but one of several circuits, and the tradesman runs about checking for presence or absence of power at each and every outlet and fixture in the building. Obviously error is the rule of the day using such a technique, due to the characteristic of human nature for taking short-cuts, or overlooking obscure outlets or fixtures. In large buildings, say an apartment building containing many units, or a commercial building, the importance for verifying circuit distribution is at least just as important as in a small building, such as a modest home, but the physical task of verification is of much greater magnitude and, in some cases, economically impractical. Given a building, such as an old house that is undergoing subdivision and renovation into condiminium or apartment units, there might be 100 or more outlets, light fixtures, and other terminations for the electrical wiring. If an electrician finds there are, for example, 12 separate wiring circuits which need to be verified, the mere allotment of 30 seconds to verify each outlet or fixture would consume 50 minutes per circuit, or conceivably 50 minutes multiplied by the 12 separate circuits, for a total of 10 hours to 100% verify the circuit connections. Simple economics dictate that 100% verification is impractical, even for this modest example. Therefore mix-ups in the circuits between housing units, where one tenant pays for another tenant's use is common. More importantly, safety factors are compromised, because true total circuit loading (e.g., how many outlets does a circuit really serve) is unknown and dangerous electrical overload may occur.

The role of a town electrical inspector is to, among other things, verify compliance with electrical codes and rules pertaining to wiring power distribution and the like in new as well as older buildings. There is an implicit responsibility thurst upon the inspector that he certify that the wiring distribution is proper and safe and, as such, there is a need for the electrical inspector to conduct an efficient and thorough checkout of the wiring network in any building which is subject for an inspector's approval. Unfortunately, the time constraints under which civil inspectors oftimes operate may contribute to their shunning all-inclusive inspection, or even an extensive amount of spot checking, of wiring load distribution. The result is less-than-complete inspection which can lead to unsafe building power distribution which can, at best, cause light-dimming and blown fuses due to overload, or else more sadly to damage or loss of a building or even human life due to fire caused by improper circuit power distribution. Additionally, the economic distress caused by cross-over of wire routing between one apartment or condimimum unit and another may be of considerable import to tenants of a multi-dwelling building.

The installation or troubleshooting of telephone circuits, and even other "low-voltage" circuits such as thermostat lines, doorbell circuits, annunciators, and the like in buildings is also subject for utilization of the advantages now taught by my instant invention. For example, a telephone installer can excite several telephone lines with the tag signals and then merely read out which line he connects to at the other end of any wires and cables which are buried in building walls. In a like way, thermostat wire runs and the like can be sorted out and verified as to "where they go", thereby saving much time for the tradesman and averting improper operation of whatever apparatus the tested circuit connects between.

Earlier teachings show much in the way of devices that light bulbs or produce sounds when "ringing out" circuits. However, these earlier artisans did not bring forth a device such as is now taught which allows simple unambiguous indication of exactly which circuit is being connected with at any of an essentially unlimited number of locations throughout a building. In particular, the inventor's of these earlier devices were silent regarding the use, as I now introduce, of a high frequency carrier signal which is uniquely modulated with a pulse train that can be detected and converted into an unambiguous indication for even a layperson.

SUMMARY

Tracing of power wiring to determine which circuit feeds each of various terminations, such as outlets, sockets, switches, and fixtures in a building, is often needed to determine power distribution and loading conditions or for identifying the circuits during building rennovation. The usual procedure used by electrical tradesmen for identifying circuits involves turning-off all but one circuit and then checking all of the possible electrical terminations for presence of power. Obviously this procedure can be very time-consuming and prone to error, due to the human tendency to "cut corners", by not thoroughly checking all of the terminations repeatedly for each circuit test step. Another frequently used circuit identification procedure requires two workers, one checking each termination while the other "flips" the circuit breakers (or loosens the fuses) one-at-a-time until power is interrupted at the checked termination location. This method suffices when only a few outlets or sockets need to be identified, otherwise it is very time consuming and costly.

I conceived that a considerable saving in time and a marked improvement in accuracy of tracing the unclear circuit routings in the typical house or other building can be provided if the electrician is equipped with a portabe, hand-held instrument which can be quickly plugged into each outlet or socket and will give clear and reliable indication of which circuit connects to that particular outlet or socket. This invention is the embodiment of a method and suitable apparatus for efficiently implementing my novel concept.

I also anticipate that utilization of my device for verifying the routing of telephone lines and the like in existing buildings, as well as new construction, can save considerable time and effort for the average telephone installer. While I tend to illustrate the essence of my invention in terms of having utility for checking electrical power circuits, the fact is that the same apparatus and techniques may be equally well used for checking out telecommunications circuits and other low-voltage power circuits, such as used for thermostat control, etc.

Clearly the method I teach provides apparatus having such features that apprentice tradesmen can utilize the tracer for wire routing verification or outlet identification with a minimum of time having to be spent for training and with little fear of mininterpretaton or error, either by the apprentice or his boss. Additionally, since the operation of, and the information display provided by the subject of my teaching is so clear and concise, the device lends itself to utilization by unskilled novices and, therefore, is certainly a candidate for being rented to homeowners, handymen, and service persons by any of the myriad tool rental companies which prevail in every major community.

Considerable technical improvement is taught regarding the efficient utilization of the high frequency carrier current power, the key objective of which is to conserve battery life. The measurement of each branch of the wiring circuit is accomplished using only a portion of the available high frequency power which might otherwise be needed in any known earlier systems, where continuous excitation is needed for each branch. Through unique pulsing of the tag signals, together with a detector scheme which responds efficiently to pulse characteristics, reliable operation can be had using only a hundred milliwatts or so of output power during each tag signal pulse period. The artisan will observe that, if there are say eight tag signal channels produced by the exciter, each tag signal pulse will be on between 9% and 16% of the time (assuming the use of 8 pre-tag pulses), and the mentioned power is the sum of all the individual pulse periods. Therefore, the battery power consumed by the amplifiers from a typical 6 vote battery hookup (consisting of four flashlight type "D" cells in series) may be on the order of 40 milliamperes, yielding long battery life and allowing extended periods of exciter operation for investigation of all of the circuits in a building.

Therefore a purpose of my invention is to provide a hand-held, portable circuit tracer which clearly indicates which circuit is connected to any outlet into which it may be plugged.

The intent of my invention is to show the method whereby the various power or telephone circuits of a building may each be separately excited with uniquely coded tag signals which can then be picked-up by a portable detector and resolved into an indication of which circuit may connect with any given outlet or other circuit termination.

The further purpose of my invention reveals a suitable exciter for producing several distinctive tag signals, each of which may be connected with separate building circuits.

Still another purpose of my invention is to describe a hand-holdable portable detector which may be plugged-into, or otherwise connected with, each power or telephone circuit outlet and socket in a building which has had its circuits excited with distinctive tag signals, thereby producing a display of which circuit connects with each respective socket or outlet.

Yet another intent of my invention is to show a method whereby circuit tracing can be accomplished far more quickly and accurately, which may lead to a more thorough investigation of the circuit connections for every outlet, socket, or other termination in a building, therefore resulting in a higher safety factor for building power distribution.

Still another purpose of my invention is to teach how a relatively low-cost tracer system, having an exciter and a detector, may be implemented as a battery operated tool suited for reliable use by electrical or telephone installation tradesmen.

An important aspect of my invention is that of teaching apparatus which operates by modulating, or keying, a high frequency (e.g., low radio frequency) signal with a unique pulse train (or sequence of pulses) having a specific signature for each tag signal.

The artisan will find another advantage of my invention to lay in the detector apparatus, wherein the ability to discern the unique pulse train modulation characteristic which is superimposed upon a high frequency signal enables good discrimination between the desired information and background noise, while providing a clear and concise indication to a user in the form of a numerical display, or other unequivocal response.

So far as is known to me, no other device provides an electrician or telephone installer with a portable instrument that produces direct read-out of which circuit connects with each outlet or socket into which the instrument may be plugged.

These and other aspects of my instant invention's improvements will become apparent as the description now unfolds.

DESCRIPTION OF INVENTION

Figure 1:
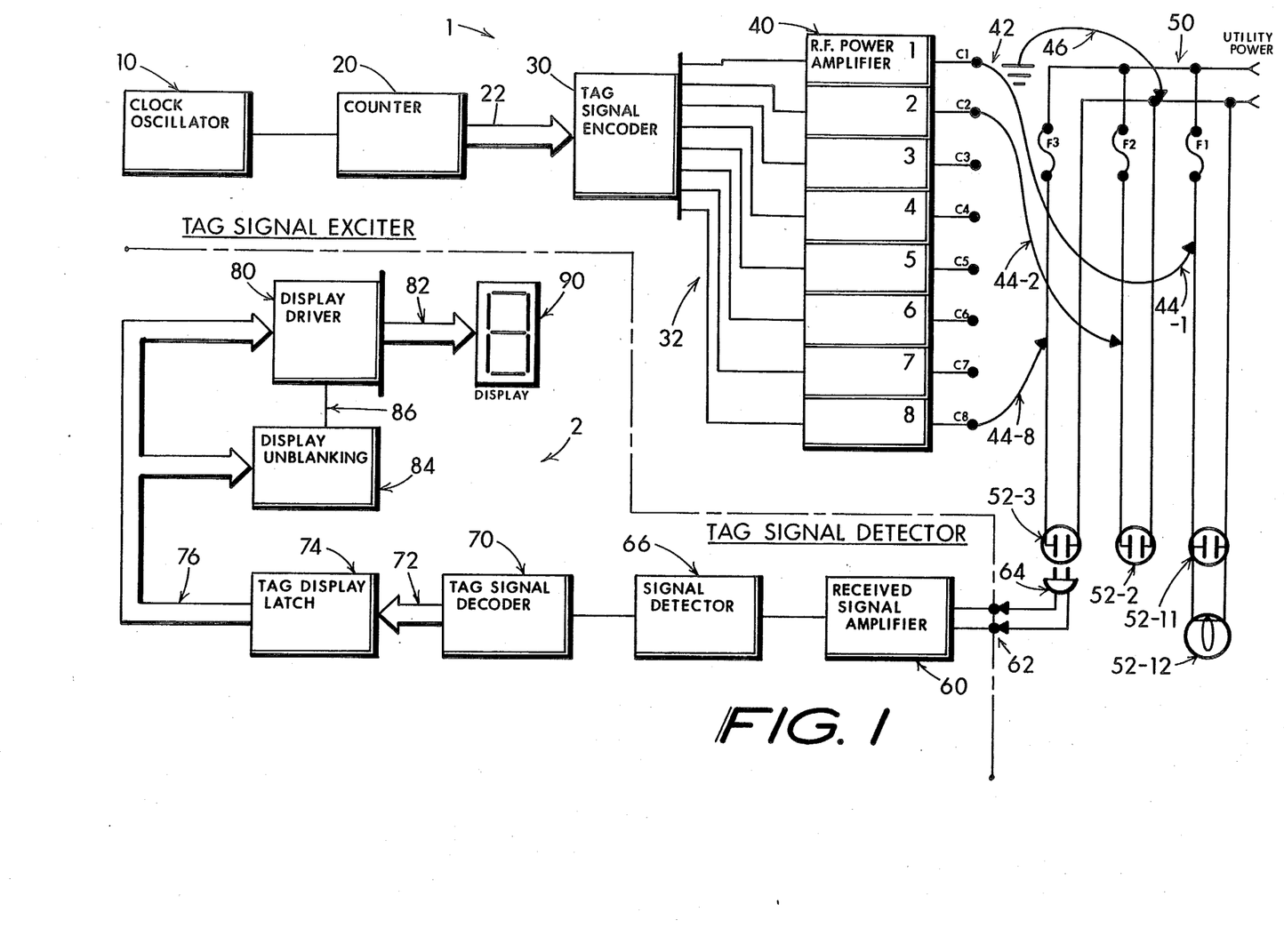
FIG. 1 Block diagram of tag signal exciter coupled with tag signal detector by way of typical building wiring circuits.

An overview of my invention is illustrated in FIG. 1, where the TAG SIGNAL EXCITER generally depicted 1 is coupled with the TAG SIGNAL DETECTOR generally depicted 2 by way of wiring circuits which might be found in a typical building, generally depicted 50.

In the exciter, a clock oscillator 10 produces a high frequency signal which couples, by way of a counter 20 having several outputs 22, with a tag signal encoder 30. The endcoder embodies digital circuits which produce unique tag pulse train signal outputs on each of the several lines 32. Each of the tag signals may typically consist of a succession of radio frequency pulses, where the radio frequency energy is gated on and off in a unique way in each channel, in accord with the pulse train characteristic of each tag signal produced by the encoder circuits. Each of the pulse gated radio frequency signals couple with one of the eight R.F. power amplifiers 40, therefrom producing a uniquely identifiable r.f. signal of goodly power level at each of the outputs 42, shown as C1 through C8.

In the preferred hookup with the building wiring 50, the tradesman might utilize clip leads or the like to first connect the ground or common connection of the exciter with the common side of the building wiring circuit, shown by lead 46. He then may connect one or more of, the several exciter outputs individually to each of the several building circuits to be checked out. This is accomplished by first removing the several fuses F1, F2, F3 so that each circuit is isolated. The tradesman then connects selected outputs, say C1, C2 and C8, of the exciter by way of leads 44-1, 44-2, and 44-8 respectively with each circuit under test. The result is that each circuit is energized with an r.f. signal having a different pulse train signature impressed upon it, and these unique pulse trains will appear at each outlet, light fixture, or other termination 52-11, 52-12, 52-2, and 52-3 which may appear on the several wiring circuits.

My tag signal detector 2 preferbly may be a hand held, portable device, convienently about the size of a pack of cigarettes, which may be carried about by the tradesman and plugged into, or clipped onto, any of the many possible circuit terminations which can be found in the typical building wiring system. In the FIG. 1 showing, a plug 64 can serve to "plug" into any one of the several outlets 52-11, 52-2, or 52-3. This plug 64 is preferably embodied as an interchangeable device, connectable with the main portion of the detector by way of connection 62. The result is that, when plug 64 is plugged into any of the several possible sockets, a portion of the pulsed r.f. signal appearing at that socket, as a result of the aforesaid exciter connections, will be presented to the input of the received signal amplifier 60. The amplified r.f. signal output is then fed to the signal detector 66, which functions to recover the tag signal pulses from the pulsed r.f. signal envelope. In the preferred form, the signal detector includes signal rectifier and signal level (automatic gain control) control circuits, whereby the later may compensate for the variations in r.f. signal amplitude which can be expected throughout a typical building wiring layout. The detail of such circuits are well known in the art.

The recovered tag signal pulses couple with a tag signal decoder 70 which acts to determine which tag signal pulse combination is received, thereby producing a binary, and preferably BCD encoded, output 72 that couples with the input of a tag display latch 74. The output 76 of the latch couples with a display driver 80, which produces outputs 82 which may be in the form of seven drive lines needed to excite a digital display such as the shown seven segment display 90.

The artisan will understand that, when the exciter and detector are connected and operated as shown in this illustrative example, plugging the plug 64 into socket 52-11 will result in the symbolic figure "1" appearing on the display 90, whilst plugging the plug 64 into either socket 52-2 or 52-3 will result in either the respective symbolic figure "2" or "8" to appear on the display 90. The tradesman is thereby given an unambiguous indication of which circuit is which in a quick and convienent way.

Figure 2:
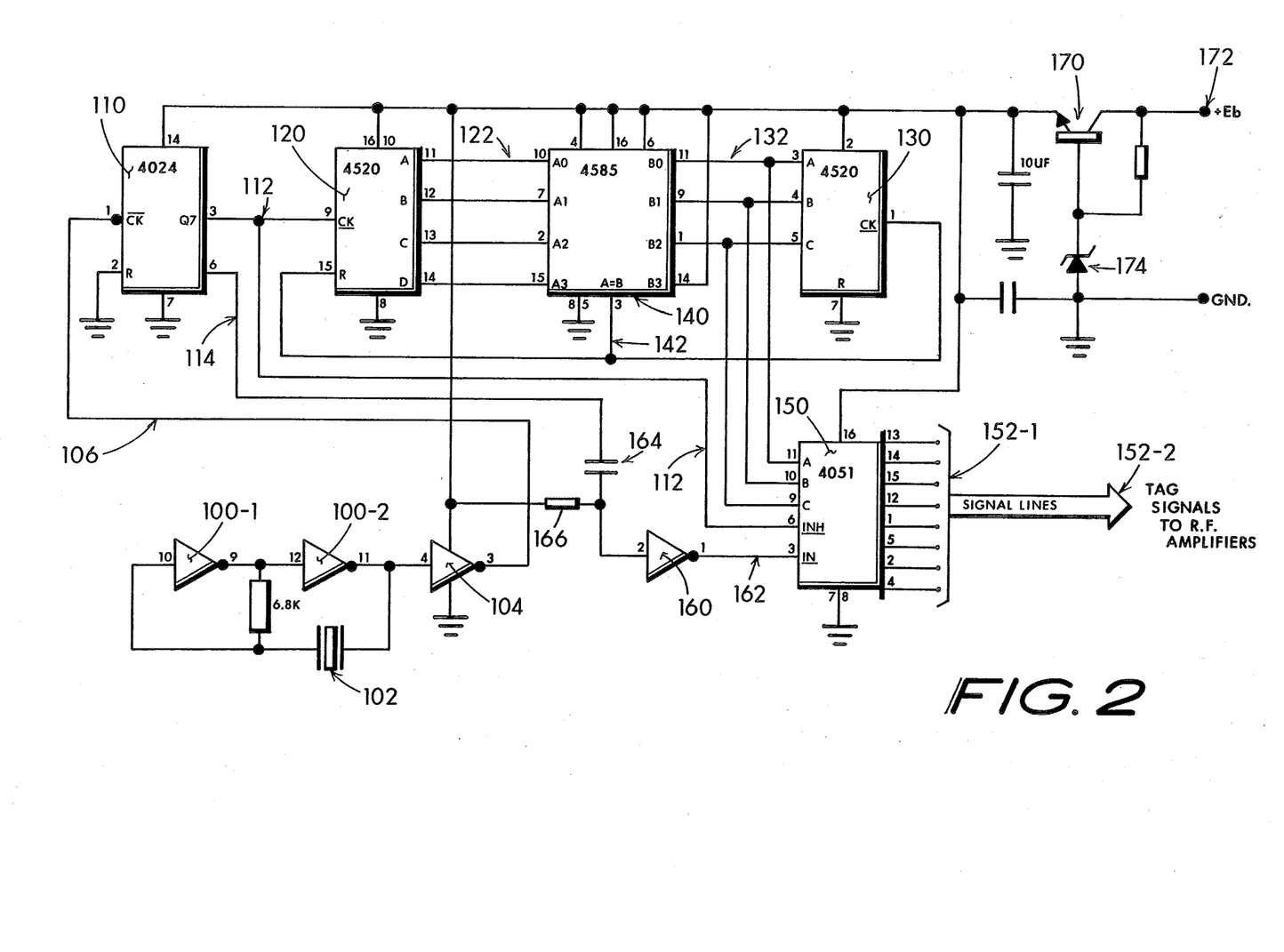
FIG. 2 Electrical schematic for a particular tag signal exciter embodiment, producing eight tag signal channels.

In FIG. 2 a preferred form for the circuitry suitable for producing a multiplicity of unique tag pulse train signals is shown. A clock oscillator, comprising inverters 100-1, 100-2 (such as Motorola Semiconductor Corporation type MC14572) are hooked together along with a quartz cyrstal 102 and biasing components to form a multivibrator configuration which is controlled to operate at the crystal frequency. In my taught embodiment, a crystal frequency of 3.58 megahertz (e.g., a common television "burst frequency" crystal) might be used. The resulting clock signal is coupled through another inverter 104 and thusly to the CLOCK input pin 1 of a 7-stage type MC14024 counter 110. The Q7 output pin 3 produces a frequency 1/128 that of the clock frequency, whilst the Q3 output pin 6 produces a frequency 1/16 that of the clock frequency. Therefore, with the mentioned crystal frequency, the frequency of the output signal on pin 6 is about 223.75 kilohertz, whilst the frequency of the output signal on pin 3 is about 27.97 kilohertz.

A pair of 4-stage counters 120, 130 and a comparator 240 are hooked together to produce the characteristic tag signal format. The first counter (½ of a MC14520) is clocked by the 27.97 kilohertz signal on line 112, producing four binary outputs 122 which correspondingly couple with the A0 through A3 inputs of the comparator (type MC14585). The other counter 130 is clocked by the recurring pulse on line 142 produced by the output A=B output of the comparator 140. The three least significant bit outputs A, B, C of counter 130 couple via lines 132 with the B0 through B2 inputs of the comparator, while the B3 input couples with the HIGH logic level. The binary control inputs of a multiplexer 150 also couple with the counter 230 output, via extensions of lines 132. The binary values so coupled serve to select the eight outputs 0 through 7 from the multiplexer, which appear on lines 152-1. The IN terminal pin 3 of the multiplexer is coupled with the 223.75 kilohertz r.f. signal on line 114 via way of a differentiator network comprising capacitor 164 and resistor 166 as coupled through inverter 160. The differentiator serves to reduce the duty cycle of the r.f. signal appearing on line 162 to about 20–30%, which enables better efficiency from the yet-to-be described r.f. amplifier circuits. A series pass transistor 170, together with a zener diode 174 provide voltage stabilization of the +Eb potential on line 172, as coupled with the $V_{DD}$ terminals of the several integrated circuits.

Figure 3:
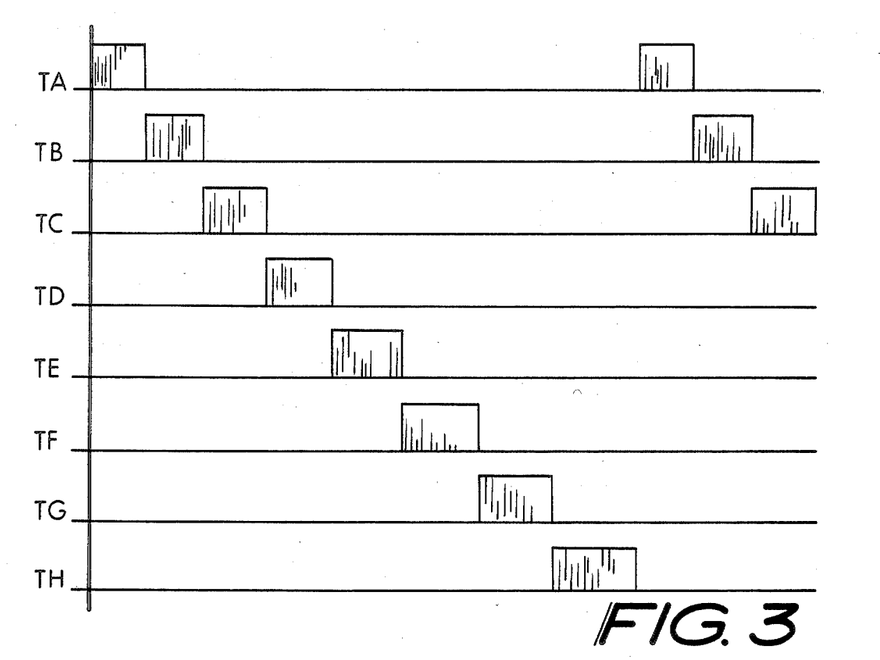
FIG. 3 Waveforms for the tag signals produced by the tag signal exciter.
Figure 4:
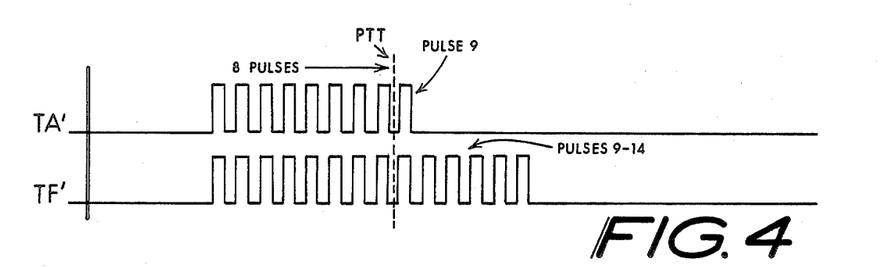
FIG. 4 Illustrative detail of tag signal waveform.

The output tag signals 152-2 produced by this circuitry can be further understood by the waveforms of FIG. 3. The TA through TH pulses each consist of an r.f. signal modulated by the tag pulses, and in turn correspond with the outputs 0 through 7 of the multiplexer 150. The artisan will note that each higher pulse waveform is slighly longer than the preceding, repeating after every eight pulses, round-robin style. By reference to FIG. 4, the actual makeup of two representative pulses can be viewed. Pulse TA' is the channel 0 signal from the multiplexer, and consists of eight "pre-tag" pulses followed by one tag pulse, viz pulse 9. In a like way, the TF' tag pulse is the channel 5 signal from the multiplexer, and consists of eight pre-tag pulses followed by 6 tag pulses, viz pulses 9-14. Now each of the individual tag pulse component pulses, while not illustrated in detail in the drawing, also consists of sixteen subcomponent pulse cycles of the 223.75 kilohertz r.f. signal fed through the multiplexer from line 162.

The generation and use of the pretag pulse portion of the waveform is not essential for the operation of the fundamental concept of my invention, but is merely included by way of design choice in the preferred embodiment to afford some control over the variation in absolute r.f. envelope pulse width variation between the no. 1 tag signal and the no. 8 tag signal code. Therefore changes in the circuit of FIG. 2, such as tying the A3 input of the comparator 140 to logic HIGH (which would serve to eliminate the 8 pretag pulses from the tag signal pulse train), are considered mere variations in the central theme of the teaching.

The pretag pulse portion of the waveform can be utilized to provide a proprietary tag signal friom the exciter. For example, if the described exciter (providing eight pretag pulses) were used with a detector designed to cooperate with a different exciter which produced say six pretag pulses, then the indication given by the detector would be erroneous. The proprietary nature of the tag signal could also be still further enhanced by using other carrier frequencies (other than the mentioned 223.75 KHz).

Figure 5:
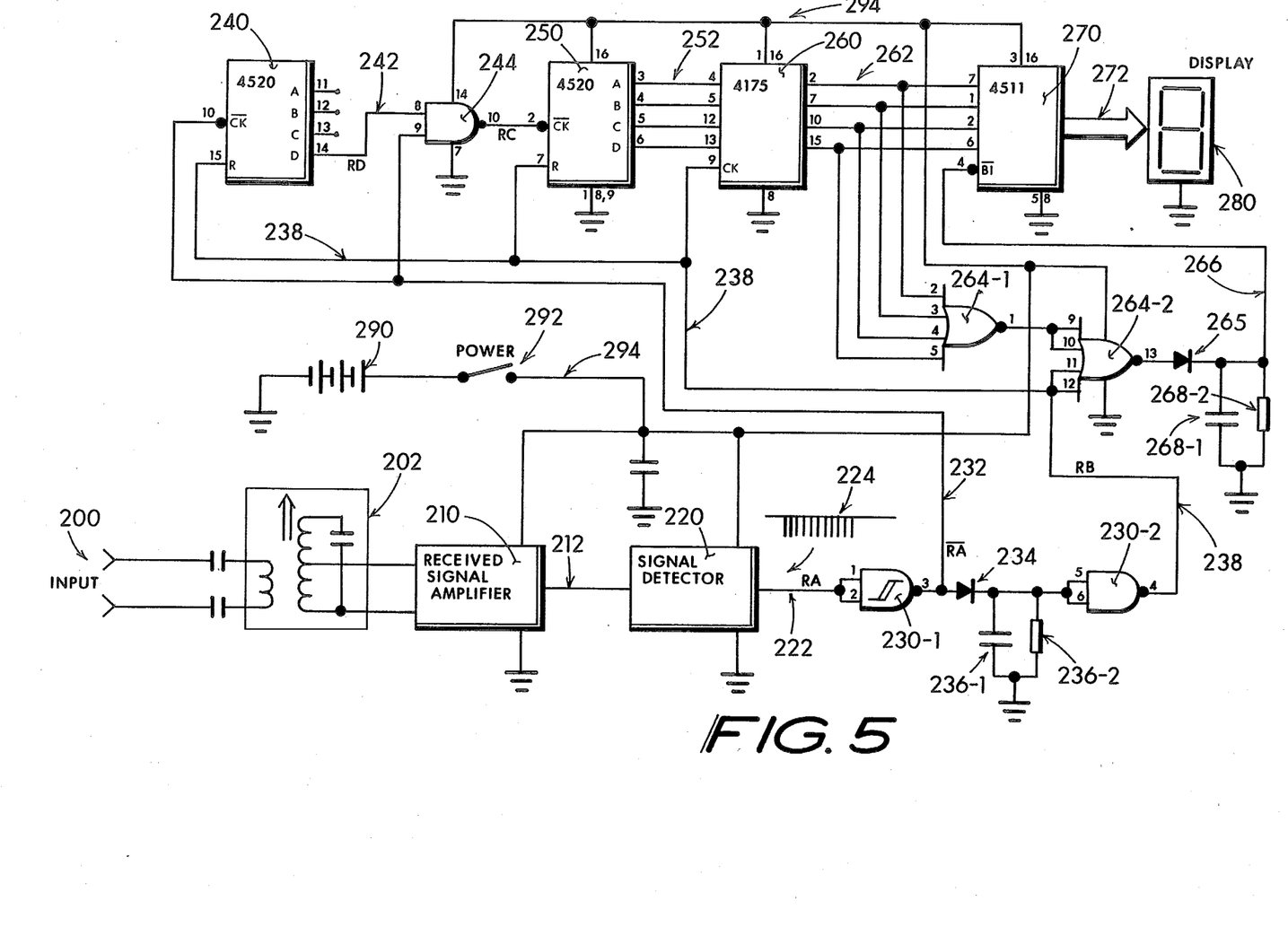
FIG. 5 Electrical schematic for a particular tag signal detector embodiment, providing display of up to eight different tag signal indications.
Figure 6:
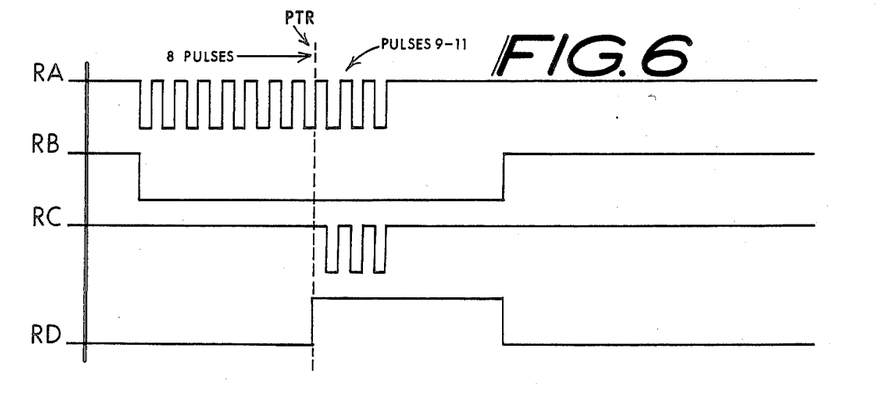
FIG. 6 Waveforms for the decoding circuitry waveforms in the tag signal detector illustrated in FIG. 5.

A suitable detector useful for practicing my invention is shown in FIG. 5, with the resultant indication provided to the tradesman being a displayed number ranging between 1 and 8 designating which wiring circuit is being measured. How this is accomplished is by having the input 200 couple with the outlet or other termination in the building wiring, whereby a small sample of the r.f. signal superimposed on the wiring is picked up and coupled through a tuned transformer 202 to the input of the received signal amplifier 210. In the preferred practice of my invention, this coupling is obtained by way of a "plug" which can be inserted into each wall socket, or else by a pair of alligator clips or the like on short leads which can be clipped onto any wires which might be accessible, such as those found associated with light fixtures. Additionally, it is anticipated that the tradesman may use any of a variety of special adapters. Specifically, these can take the form of such devices as screw-in connectors which can be used with light bulb sockets, etc. The output from the amplifier 212 couples with the signal detector 220, whereupon the tag signal waveform 224 is demodulated from the r.f. signal envelope. The detected tag signal is coupled via line 222 to the input of a (preferably schmidt trigger mode) inverter 230-1 (R.C.A. type CD4093BE), with the output pulses on line 232 coupled with the CLOCK input pin 10 of a 4-bit counter 240, and also through diode 234 to the integrating network including capacitor 236-1 and resistor 236-2. The integrator time constant is selected to be longer than the duration of the r.f. envelope pulse TH of FIG. 3, while shorter than the interval between the TH pulses. A time period of about 20 milliseconds has been used with the aforesaid tag signal frequency values. The inverter 230-2 conditions the integrated signal to CLOCK the latch 260, and to reset the counters 240 and 250. Counter 240 "counts" the pretag pulses, and when 8 have been received the D output signal on line 242 goes HIGH, enabling the thereto coupled input of NAND gate 244. This allows the tag pulses on line 232 to now actively clock counter 250 with whatever number of component tag pulses occur successive to the eight pretag pulses. The waveform illustration of FIG. 6 shows these events, with the incoming signal RA representing 8 pretag pulses followed by 3 component tag pulses (pulses 9-11). The signal RB is the (shortest acceptable) pulse appearing on line 232, which enables the counters 240 and 250. The waveform RD depicts the D output of counter 240, whereby when it goes HIGH, whatever number of tag pulses that may occur, depicted by pulses RC, are permitted to couple with counter 250.

The latch 260 holds whatever data is present at the input from counter 250 whenever the signal on line 238 goes HIGH. The stored output from the latch couples to the decoder/display driver 270 inputs via lines 262 and thence to the display segments of the seven-segment L.E.D. common cathode display 280 (exampledly a Hewlett-Packard type HDSP-7503) via a plurality of drive lines 272 (including customary current limiting resistors of about 270 ohms for each segment, which are not shown). The data lines 262 also couple with the inputs of NOR gate 264-1, which produces a LOW output when any one of the inputs are HIGH, indicating that displayable data is available. The output of NOR gate couples with a second NOR gate 264-2, while the other input of that NOR gate couples with the RA signal on line 238. These components, including diode 265 and integrating network having capacitor 268-1 and resistor 268-2 perform a necessary unblanking function. The shown embodiment is setup to present a LOW level to the blanking input pin 4 of the driver 270, thus blocking the drive of the display 280. The presence of a LOW level RB signal on line 238 produced by the presence of a decoded tag signal and the presence of some valid data on the display data lines 262 must occur in order to produce a HIGH on the output of gate 264-2 which, coupled through diode 260, will in turn UNBLANK the driver 270 and permit the display to light up.

The understood variation to this shown circuit necessary to have cooperation with an exciter producing a tag signal format having no pretag signal includes principally the elimination of counter 240 and gate 244, with the signal on line 232 being coupled with pin 1 (that being the positive-edge triggered clock input terminal) of counter 250, whilst pin 2 of he counter is tied HIGH.

A battery 290, coupled by way of switch 292 provides the necessary direct current power on line 294 and enables portable operation of the apparatus by a tradesman in a variety of work situations.

Figure 7:
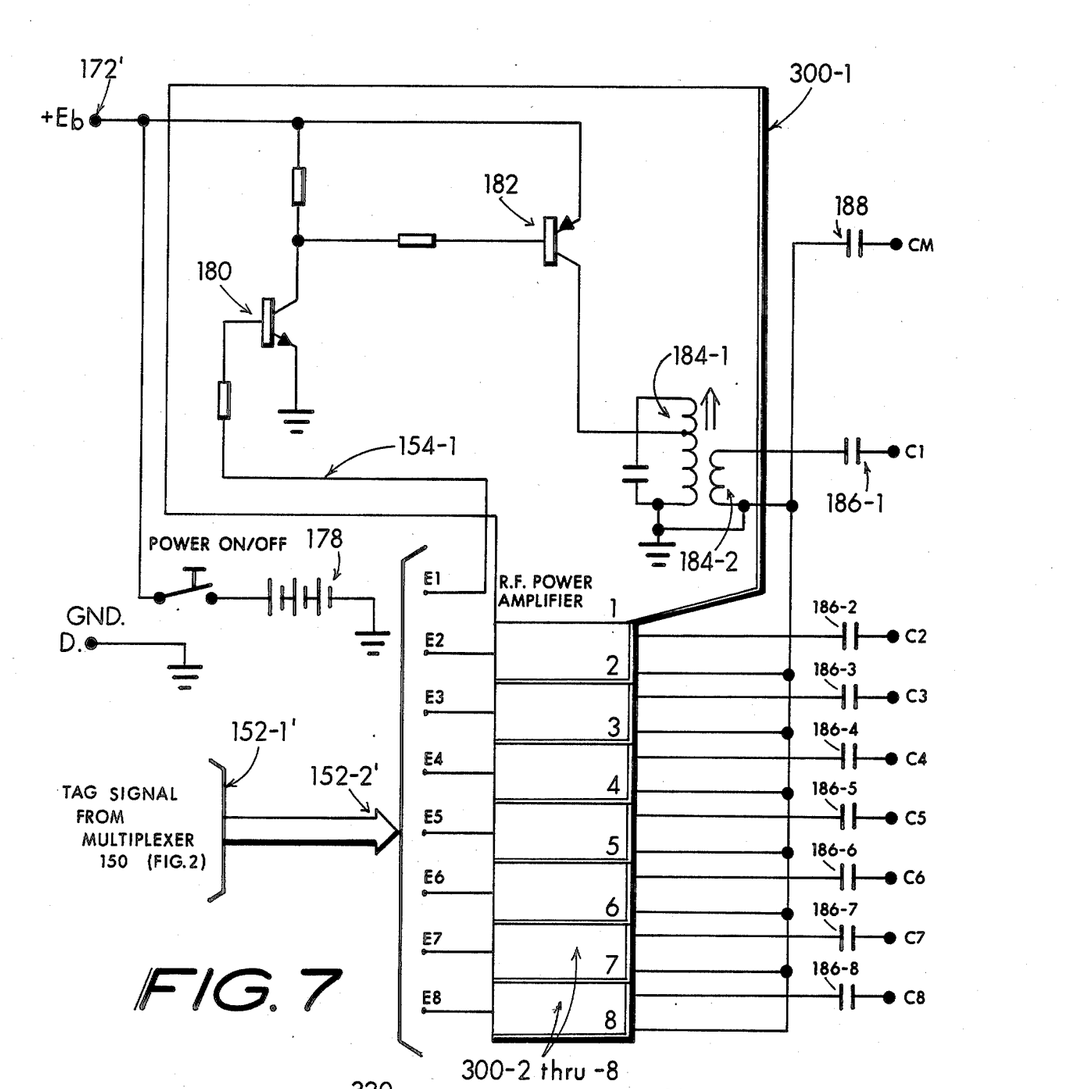
FIG. 7 R. F. Power amplifier circuit details for each of the tag signal channels, such as coupled with the exciter circuit illustrated in FIG. 2.

The r.f. amplifier portion of the exciter is shown in some detail in FIG. 7. The tag signal obtained from the multiplexer 150 of FIG. 2 couples by way of signal lines 152-2' with the several inputs E1 through E8 of the R.F. Power Amplifiers 300-1 through 300-8. The #1 channel power amplifier 300-1 is shown in detail to include a transistor 180 having its base coupled via line 154-1 with the E1 connection with the tag signal source, whilst the collector of the transistor 180 couples with the base of a second power transistor 182. The collector of the second transistor in turn couples with the tuned primary 184-1 of a resonant transformer. By establishing the base drive pulse coupled with transistor 180 to have a duty cycle of 20-30% (e.g., 72 to 108 electrical degrees), as obtained by elements 164 and 166 as discussed for FIG. 2, I have found that the electrical efficiency of the amplified signal coupled through the transformer 184-1 due to the inherent "Q" characteristics of the tuned circuit is considerably improved, with the result that longer battery life may be obtained. Of course, it is understood that the design choice of a different transformer or of a different tuned network arrangement will necessitate the choice of a different duty cycle. The transformer 1 used was a small tuned transformer of the type commonly used for intermediate frequency stage coupling in transistorized radios, with resonance set for 223.75 kilohertz. The transformer secondary 184-2 then couples between "ground" and the output C1 (see FIG. 1) through capacitor 186-1. Operating conditions (transistor bias points, etc.) for the overall circuit are preferentially established by design to obtain about 100 milliwatts or so of high frequency energy output (during the tag pulse signal interval) from the transformer secondary. A common connection CM is also coupled with the mentioned "ground" by way of capacitor 188, which is used to reduce electrical shock hazard from the typical 60 hertz power which appears on the usual utility power circuits.

The other seven shown amplifiers are substantially the same electrical hookup, with their respective outputs coupled by way of capacitors 186-2 through 186-8 with terminals C2 through C8. I also show a battery 178 providing a source of portable power, and the terminal 172' provides interconnection of this power with the circuit taught in FIG. 2.

Figure 8:
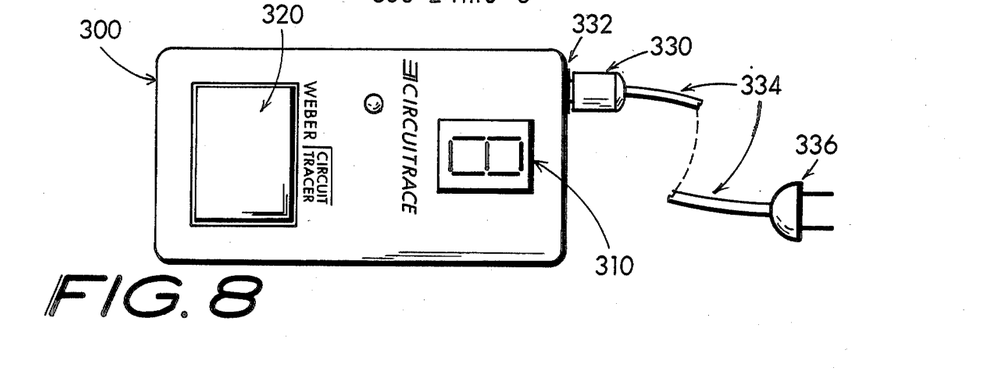
FIG. 8 Illustrative form of handheld tag signal detector device.

A preferred physical embodiment for my invention is illustrated in FIG. 8. A small utility case 300, in the form of a small box about 3½" wide by 5¾" long by 1⅝" deep serves to house the electronic circuits shown in FIG. 5, including the indicative display 310 and a press-to-operate switch 320. The small plug 330 couples with a receptacle 332 on the case thereby enabling the useful connection of the test plug 336 with the detector circuits by way of cord 334. Alternatively, the plug 336 may be terminations such as alligator clips or the like. With a removable backside, the shown case structure can provide for easy battery replacement in the field.

Figure 9:
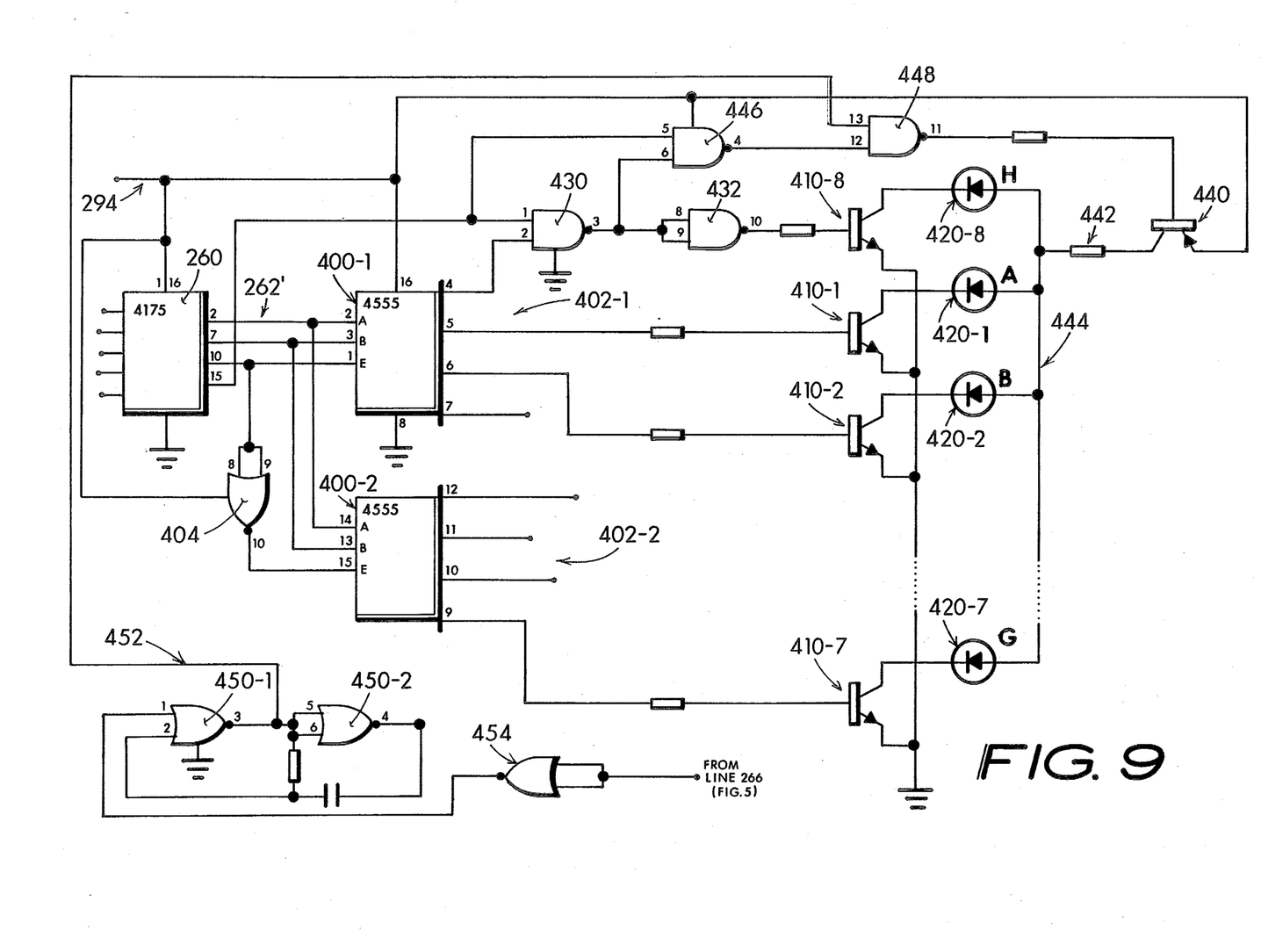
FIG. 9 Electrical schematic for digital display having several separate indicating lights, one for each channel.

While in the discussion given for FIG. 5 I described my tracer to provide the tradesman with an indicative digital display in the form of a visible number or the like, I also anticipate that there is some advantage in having the digital display given as one of several indicator lights. This is to say that, when a signal is received, the tag signal which is decoded serves to actuate circuitry which illuminates a light that is unique to that particular tag signal value. In practical utilization of this tag signal value to display value translation method, the lights are arranged as a row of light emitting diodes with a space beside each which has either pre-printed indicia showing which circuit each light is associated with, or else the space may allow for the user to write-in his own notations. FIG. 9 now serves to show how such a display embodiment may be economically accomplished as an adjunct to portions of the detector circuits of FIG. 5. A pair of 2-line to 4-line decoders 400-1, 400-2 (perchance Motorola type MC14555) couple with the output lines 262 of the latch 260 (as discussed for FIG. 5). The ENABLE input of decoder 400-2 is coupled with the C data line via an inverter 404 in order that the overall decoder configuration may opeate as a 3 line to 8 line decoder, providing outputs on lines 402-1, 402-2 in response to the binary (BCD) input signals. A NAND gate 430 is specially utilized to enable the usual binary "0" output from the decoder to be blocked, and to instead produce a LOW output from gate 430 when the binary signal is equivalent to binary 8, e.g. "0001". The arrangement can be as shown in the figure, wherein the binary values respond as follows:

| Binary Value (Lines 262) | | | | Output Indication |
|---|---|---|---|---|
| 0 | 0 | 0 | 0 | NONE |
| 1 | 0 | 0 | 0 | A |
| 0 | 1 | 0 | 0 | B |
| 1 | 1 | 0 | 0 | C |
| 0 | 0 | 1 | 0 | D |
| 1 | 0 | 1 | 0 | E |
| 0 | 1 | 1 | 0 | F |
| 1 | 1 | 1 | 0 | G |
| 0 | 0 | 0 | 1 | H |

The output from gate 430 thusly drives transistor 410-8 via inverter 432, whereby when the transistor 410-8 is turned on, the cathode of light emitting diode 420-8 is pulled near ground and, other conditions permitting, the diode emits light thereby obtaining the attention of the user.

The outputs 402-1 serve to drive transistors 410-1 thru 410-7 (with 410-1, 410-2 and 410-7 shown and the others 410-4 thru 410-6 being hooked up in a like way) which, when turned on pull the cathode of each respective light emitting diode 420-1 thru 420-7 to near ground, while the anode of each diode is coupled via line 444 through a transistor 440 with the battery positive supply line 294. The NAND gate 446 operates to enable the display gate transistor 440 for the active binary states, including state "8" (0001). The NOR gates 450-1, 450-2, together with inverter 454, make up a multivibrator oscillator which is predetermined by choice of resistor and capacitor components to operate at about 3 to 7 hertz, resulting in a squarewave signal on line 452 which couples with NAND gate 448. The purpose of this combination is to produce blinking of whichever of the light emitting diodes that may be turned on. This blinking effect is beneficial in providing enhanced visibility of the display when background light is high, such as during daylight operation when a lot of sunlight or the like may be present. I also have found that including this same type of blinking light effect even with the numerical display as taught for FIG. 5 can serve to enhance discernability of the displayed value.

The practicing artisan will realize that the advantages of my invention have been described in terms of certain preferred embodiments and exemplified with respect thereto in order to give understanding of the essence of my invention's concept in tangible terms. Those persons skilled in the art, however, will also readily appreciate that various modifications, changes, omissions, and substitutions may be made in not only the structure as illustratively taught, but also in the character of the associated signal waveforms, without departing from the essential spirit of the invention.

The tag signal format may comprise any pulse train signature, including those wherein the individual pulses comprising the pulse train may be modulated and therefore differ from one-another in frequency (e.g., such as provided by a succession of discontinuous "tones", either singularly or in some plural arrangement) which can provide distinctive and substantially separate excitation of a number of building wiring circuits. In accord with this, the use of detector appratus suitable for responsion with the selected tag signal format and producing a digital display of the circuit identification may also be said to be within the scope of the instant teaching.

My description speaks particularly of an eight channel exciter producing a plurality of tag signals suitable for uniquely coding eight separate wiring circuits, which then are variously detected and used to give a visual display of "1" through "8" merely as a form of illustration of a practical, demonstratable apparatus. Clearly an artisan will appreciate that some other number of tag signal channels, say four or perhaps sixteen, is merely a matter of design choice and has no implied limitation on the character of the invention's underlying operation.

Moreover, the artisan shall know now that while I teach the invention in the foregoing description for having utility in identifying wiring circuits as associated with power wiring in a building, this is for mere illustrative purposes, and that the use of my taught apparatus and principles are of equal import for tracing and identifying wiring runs for telephone circuits and signal wiring installations.

What I claim is:

1. Circuit tracer method effective for identifying each of several substantially separate circuits, comprising the steps of:
   a. providing a source effective for developing a plurality of uniquely coded tag signals each comprising a high frequency signal effectively modulated with a distinctive substantially lower frequency pulse train signal;
   b. exciting each of said several circuits with a substantially separate uniquely coded tag signal;
   c. sensing the tag signal on at least one of possibly several terminal locations on each said circuit;
   d. indicating which uniquely coded tag signal is being sensed; and,
   e. utilizing the indicated tag signal for circuit identification.

2. Tracer method of claim 1 comprising the further steps of:
   a. producing each of the distinctive pulse-train signals comprised as a succession of binary pulse groups each having a unique number of component pulses;
   b. providing said high frequency signal as a source of radio frequency signal having a substantially separate output for each of the several circuits to be traced;
   c. modulating each of the separately outputted radio frequency signals with a different one of the distinctive binary pulse-train signals; and,
   d. coupling each of the modulated radio frequency signal outputs in a substantially separate way with each traceable said circuit.

3. Tracer method of claim 2 further comprising the steps of:
   a. coupling an input of a high frequency amplifier to various termination locations along each said circuit remote from the position where the modulated high frequency signal is effectively coupled into the said circuit, whereby said amplifier serves to receive said tag signal and produce an output therefrom;
   b. separating the distinctive lower frequency pulse train component of the tag signal from the high frequency signal appearing at the output of the amplifier;
   c. effectively counting the number of the binary component pulses comprising the separated pulse train signal and producing an output signal therefrom which is distinctive in character for each binary pulse group; and,
   d. indicating an effective value representative of the distinctive character of the output signal produced by the uniquely coded tag signal instantly received at each remote circuit location.

4. Circuit tracer method of claim 2 comprising the further step of producing each of the binary pulse groups to recur in time succession, that being the first group followed by the next group and so on until the last group is complete, whereupon said first, next, and last groups recur cyclically.

5. Circuit tracer method of claim 2 comprising the further step of producing the binary pulse groups to each comprise a predetermined like number of pretag pulses succeeded by a unique number of one or more tag pulses.

6. Circuit tracer method of claim 5 wherein said number of pretag pulses may be predeterminately different in number when produced by different said tag signal sources, thereby effecting proprietary tag signal structure.

7. Circuit tracer method of claim 1 wherein said indicated tag signal may be produced as a digital display providing a visible telltale to an operator, wherefrom substantially unambiguous identification of the tag signal present at the instantly obtained circuit terminal location may be interpreted.

8. Circuit tracer apparatus effective for identifying each of several circuits comprising:
   a. portable exciter means including:
     aa. generating means producing several uniquely coded tag signals each comprising a high frequency signal modulated by a distinictive lower frequency pulse train signal;
     ab. plural driver means coupled with said generating means and effective for amplifying and coupling each of the several tag signals in a substantially separate way with each of the several circuits;
   b. portable detector means including:
     ba. sensing means useful for portably coupling with at least one of possibly several locations on each of the several circuits and receiving the tag signal present at the coupled circuit location;
     bb. decoding means coupled with said sensing means and effective to detect instantly present said pulse train signal and thereby produce an indicant signal value relatable to each unique code effectively provided by the received tag signal; and, bc. display means coupled with said decoding means and effective to produce a display of said incident signal value.

9. Circuit tracer apparatus of claim 8 wherein said generating means further comprises:
   a. binary pulse source means effective for providing a plurality of substantially separate binary pulse train signals each composed of a succession of distinctive component pulses, wherein means producing the component pulse composition provides for a unique timing of at least the duration of a first binary level, alternating with a second binary level;
   b. high frequency signal source means; and,
   c. plurality of combining means coupled with said binary pulse source means and said high frequency signal source means, effective for producing the several uniquely coded tag signal outputs therefrom each comprising a portion of the high frequency signal effectively modulated by a different one of said separate binary pulse train signals.

10. Circuit tracer means of claim 9 wherein:
   a. said sensing means comprises high frequency amplifying means having input means couplable with said at least one of possibly several locations in each of the several circuits for receiving a portion of any tag signal which may be present therein, having an output therefrom producing an enhanced replicate of said tag signal;
   b. said decoding means comprises detecting means coupled with said amplifying means output effective to separate the binary pulse train signal from the high frequency signal, producing a binary pulse train signal output therefrom; and,
   c. said decoding means further comprises pulse duration time measurement means coupled with said detecting means which effectively measures the time period of preferably the first binary level comprising the distinctive component pulse signal which makes up the character of the binary pulse train signal and wherein an indicant signal value is produced at an output therefrom which relates to the unique time period duration of the measured component pulse first binary level.

11. Circuit tracer means of claim 10 wherein:
   a. said measurement means comprises binary counter means coupled with a clock means, wherein said counter means incrementally advances through several count states from an initial value to a subsequent value during the distinctively measurable time period of the component pulse first binary level duration
   b. storage means is coupled with said counter means and is effective to hold the highest count state obtained by said counter means during said component pulse first binary level time duration, said highest count state being entered into said storage means whenever said component pulse second binary level is produced, whereupon further once said storage entry has been attained, said counter means is reset to an initial value; and,
   c. digital display means couples with said storage means to provide unambiguous indication of stored count state value.

12. Circuit tracer apparatus of claim 11 wherein said digital display means comprises a plurality of visual indicating devices, such as light emitting diodes, in orderly arrangement such as an array, and associatable with telltale indicia as to which indicating device represents which traced circuit.

13. Circuit tracer means of claim 9 wherein said binary pulse train signals each comprise a succession of pulse groups having a unique number of component pulses relative with any other so produced pulse groups comprising each of the separate binary pulse train signals.

14. Circuit tracer apparatus of claim 13 wherein said pulse groups each comprise substantially the same number of pretag pulses succeeded by a distinctive number of tag pulses, whereby the total number of pulses produced in any predetermined group of pulses determines the unique character of each of the unique tag pulse train signals.

15. Circuit tracer apparatus effective for identifying each of a plurality of circuits including:
   a. portable exciter means producing several unique tag signals each comprising a high frequency signal modulated by a distinctive lower frequency pulse train signal and each being couplable to a different one of said plurality of circuits; and,
   b. detector means having an input couplable with any one of said plurality of circuits and providing indication of which unique tag signal is superimposed thereon by way of display means.

16. Circuit tracer apparatus of claim 15 wherein:
   a. said exciter means includes:
      aa. pulse generator means effective for producing a plurality of unique lower frequency pulse train signals;
      ab. high frequency signal source means;
      ac. plurality of combining means coupled with said pulse generator means and said high frequency signal source means effective for producing several unique tag signal outputs therefrom each comprising a portion of the high frequency signal effectively keyed between at least two levels by a different one of said unique lower frequency pulse train signals;
   b. said detector means includes:
      ba. high frequency signal amplifying means having an input couplable with any one of said plurality of circuits effective for receiving traceable tag signals therefrom;
      bb. demodulator means coupled with said amplifying means, effective for separating said lower frequency pulse train signal from said high frequency signal, producing a tag pulse train signal therefrom;
      bc. decoding means coupled with said demodulator means, effective to produce an indicant signal value relatable to the effective value of the demodulated tag pulse train signal; and,
      bd. indicative means coupled with said decoding means, effective for producing sensory translation of said indicant signal value.

17. Circuit tracer apparatus of claim 16 wherein said tag pulse train signals each comprise a succession of pulse groupls having a unique number of component pulses relative with any other so produced tag pulse train signals.

18. Circuit tracer apparatus of claim 17 wherein said pulse groups each comprise substantially the same number of pretag pulses succeeded by a distinctive number of tag pulses, whereby the total number of pulses produced in any predetermined group of pulses determines the unique character of each of the distinctively separate tag pulse train signals.

19. Circuit tracer apparatus of claim 16 wherein said tag pulse train signals each occur in time succession, having effectively no time coincidence therebetween.

20. Circuit tracer apparatus of claim 15 wherein said high frequency signal comprises a radio frequency signal selected in the range of about 10 kilohertz to about 1 megahertz.

* * * * *